United States Patent [19]

Takahashi

[11] Patent Number: 5,349,744
[45] Date of Patent: Sep. 27, 1994

[54] GRADIENT COIL AND GRADIENT COIL UNIT FOR MRI AND METHODS OF MANUFACTURING THE SAME

[75] Inventor: Ryoichi Takahashi, Otawara, Japan

[73] Assignee: Kabushiki Kaisha Toshiba, Kawasaki, Japan

[21] Appl. No.: 882,437

[22] Filed: May 13, 1992

[30] Foreign Application Priority Data

May 15, 1991 [JP] Japan .................................. 3-110593

[51] Int. Cl.$^5$ .............................................. H01F 7/06
[52] U.S. Cl. .................................. 29/602.1; 324/318
[58] Field of Search ....................... 29/602.1, 608, 605, 29/606, 609, 825; 72/324, 325; 324/318, 322; 128/653.5

[56] References Cited

U.S. PATENT DOCUMENTS

| | | | |
|---|---|---|---|
| 3,911,716 | 10/1975 | Weglin | 72/324 |
| 4,733,189 | 3/1988 | Punchard et al. | 324/318 |
| 4,737,716 | 4/1988 | Roemer et al. | 324/319 |
| 4,794,338 | 12/1988 | Roemer et al. | 324/39 |
| 4,847,985 | 7/1989 | Aubert | 29/602.1 |
| 4,873,757 | 10/1989 | Williams | 29/602.1 |

FOREIGN PATENT DOCUMENTS

3-3216  5/1989  Japan .

*Primary Examiner*—Louis Arana
*Attorney, Agent, or Firm*—Limbach & Limbach

[57] ABSTRACT

A gradient coil for MRI is manufactured by including following steps; a stamping step of stamping a plurality of gradient coil pieces having predetermined patterns out of a conductor plate, a forming step of curving the stamped gradient coil pieces in conformity with a curvature of an outer circumferential surface of a bobbin, and a lamination step of superposing the curved gradient coil pieces one on another as a gradient coil(i.e., an x-coil and a y-coil). An insulating adherent sheet having a hole is interposed between the two superposed gradient coil pieces having curled patterns but opposite curling directions to each other. The inner ends of the two interposed coil pieces are electrically connected in series through the hole of the sheet and the outer ends of them provide current input and output terminals. Two pairs of saddle-like x-coils and two pairs of saddle-like y-coils and two solenoid z-coils are further laminated with insulating adherent sheets to form a gradient coil unit. Such a gradient coil unit can be applied to active shield-type gradient coil units.

16 Claims, 11 Drawing Sheets

GRADIENT COIL AND GRADIENT COIL UNIT FOR MRI AND METHODS OF MANUFACTURING THE SAME

This invention relates to a gradient coil, and a gradient coil unit for use in a magnetic resonance imaging (MRI) system and a method of manufacturing those gradient coil and gradient coil unit and, more particularly, to a gradient coil and a gradient coil unit constructed in such a manner that gradient coils, (an x-coil, a y-coil and a z-coil) are wound on a hollow cylindrical bobbin.

An MRI system is arranged to provide, for diagnosis, image information which relfects upon at least one of the spin density and its relaxation time constant of particular nuclei in a diagnosed portion of the body of a subject such as patients by utilizing magnetic resonance. This MRI system consists of a table unit on which a subject lies on his or her back, a magnet unit for generating a uniform (static) magnetic field in a frame, a transmission/reception coil unit for transmitting high-frequency waves for magnetic resonance in the static magnetic field while receiving a magnetic resonance signal (MR signal) from the subject, a gradient coil unit for generating gradient magnetic fields for adding information on spatial positions to the MR signal, a controller unit for controlling the whole system and for processing the MR signal, and other units.

The gradient coil unit has gradient coils placed on the frame. Gradient magnetic fields generated by these gradient coils have intensity gradients along spatial axes (e.g., in the direction of X-, Y- and Z-axes of an orthogonal coordinate system). MR signals observed under these gradient magnetic fields therefore include information on spatial positions, and the MRI system can reconstruct an image from the detected MR signals.

Figure 21:
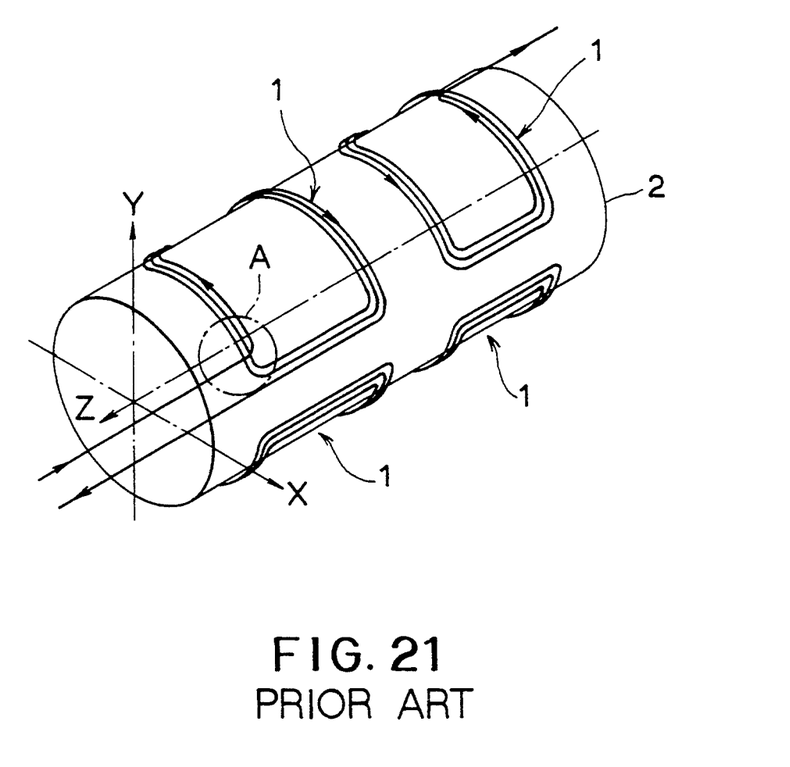
FIG. 21 is a perspective view of a Y-direction gradient coil manufactured by the conventional method.

FIG. 21 is a perspective view of a conventional gradient coil unit. The gradient coil unit shown in FIG. 21 is arranged to generate a gradient magnetic field in the direction of Y-axis and has gradient coils 1 . . . 1 placed on a hollow cylindrical bobbin 2. The gradient coils 1 . . . 1 (four in all) consist of two groups of flat conductors which are wound into saddle-like shapes in positions on the bobbin 2 for generating a Y-axis gradient magnetic field (located at the top and the bottom of the outer circumferential surface of the bobbin 2 as viewed in FIG. 21) with certain geometrical positional accuracy. Currents are caused to flow through the coils 1 . . . 1 to generate a Y-axis gradient magnetic field.

By this method of manufacturing a gradient coil unit, however, a coil arrangement having improved positional accuracy cannot be achieved because flat conductors wound on the bobbin by being bent undulate easily on the outer circumferential surface of the bobbin. The accuracy of the intensity of the magnetic field with respect to the spatial position is also reduced. In the case of mass-producing coil units by this method, the finished size of gradient coils varies since coil winding having low positional accuracy as described above is performed on respective bobbins.

Moreover, a lead conductor from a coil end intersects the coil in an area A shown in FIG. 21, so that the thickness of one coil layer is twice as large as the thickness of the conductor in the state of being attached to the bobbin 2. That is, half of the space for one coil layer is ineffective in forming the magnetic field. Therefore, useless space containing no conductor is included in the coil unit, so that the thickness of the gradient coil unit becomes unnecessarily large, resulting in an increase in the overall size of the MRI system and, hence, an increase in the system installation space.

SUMMARY OF THE INVENTION

Accordingly, it is a primary object of the present invention to provide a gradient coil and a gradient coil unit for MRI and methods of manufacturing the same in which coil arrangement positional accuracy is improved and variation in the finished size is limited.

It is another object to be able to reduce the overall size of the coil while a large number of turns is selected.

It is another object to produce an active shield-type gradient coil unit easily.

A method of manufacturing a gradient coil for magnetic resonance imaging wound in a predetermined position on a nonmagnetic hollow cylindrical bobbin, the method comprising: a preparatory step of preparing a conductor plate; a stamping step of stamping said gradient coil having a predetermined pattern out of the prepared conductor plate; and a forming step of curving the stamped gradient coil in conformity with a curvature of an outer circumferential surface of the bobbin.

A method of manufacturing a gradient coil for magnetic resonance imaging wound in a predetermined position on a nonmagnetic hollow cylindrical bobbin, the method comprising: a preparatory step of preparing a conductor plate; a stamping step of stamping a plurality of gradient coil pieces having a predetermined pattern out of the prepared conductor plate; a forming step of curving the stamped gradient coil pieces in conformity with a curvature of an outer circumferential surface of the bobbin; and a lamination step of superposing the curved gradient coil pieces one on another as said gradient coil.

Preferably, an insulating adherent sheet is prepared interposed between the gradient coil piece. Further, an adherent sheet having a hole at a predetermined position of the sheet is selected, a plurality of gradient coil pieces each having either one of two curling patterns in which the curling directions are opposite each other and each having an end capable of being positioned at the hole of the sheet, and the two gradient coil pieces having the opposite curling directions on opposite surfaces of the sheet are arranged and electrically connecting in series the gradient coil pieces positioned on opposite surfaces of the sheet through the hole of the sheet. Further, the gradient coil is at least one of an x-coil and a y-coil, and the number of the gradient coil pieces is two.

A method of manufacturing a gradient coil unit also includes the above-mentioned processes. In particular, an active shield-type gradient coil unit in which two laminated bobbins having different diameters can adopt the above-mentioned processes for each of the two bobbins.

Thus, a coil undulation in the case of winding a wire in sequence on a bobbin can be prevented and the coil arrangement accuracy can be improved. In the case of mass production, coil pieces are stamped out by using the same forming piece, so that the variation in the finished size can be eliminated.

Further, each adjacent pair of superposed coil pieces are connected through the hole of the sheet, and the number of turns of one continuous coil can be increased by connecting a plurality of coil pieces in this manner to increase the gradient magnetic field intensity. However, no unnecessary space is formed in this arrangement because there is no possibility of occurrence of a coil intersection in one gradient coil layer. The overall thickness of the gradient coil and its unit can be markedly reduced in comparison with the conventional arrangement.

BRIEF DESCRIPTION OF THE DRAWINGS

The accompanying drawings which are incorporated in and constitute a part of this specification, illustrate embodiments of the present invention and, together with the description, serve to explain the principle of the present invention; in which.

DESCRIPTION OF THE PREFERRED EMBODIMENTS

Preferred embodiments of the present invention will be described below with reference to the accompanying drawings.

Figure 1:
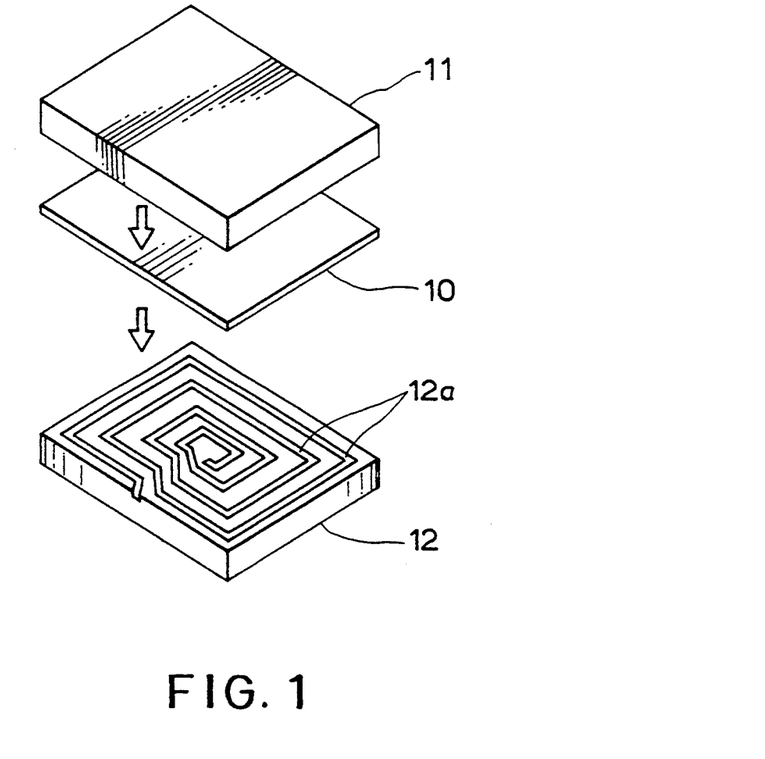
FIG. 1 is a diagram of a step of stamping a copper plate in a manufacturing method in accordance with a first embodiment of the present invention.

The first embodiment of the present invention will be described with reference to FIGS. 1 to 19. FIG. 1 is a perspective view of a part of a preparatory process for manufacturing a gradient coil unit in accordance with the first embodiment.

Figure 2:
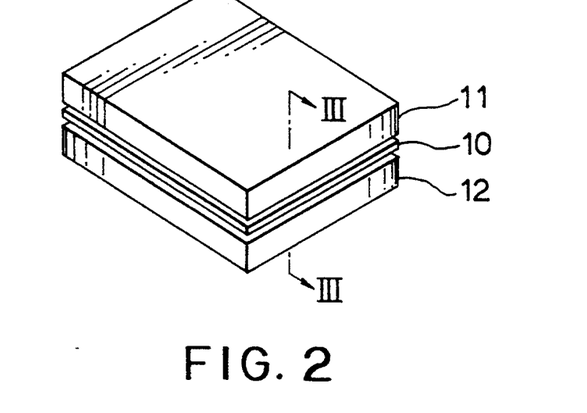
FIG. 2 is a perspective view of a forming dies between which the copper plate is pinched.
Figure 3:
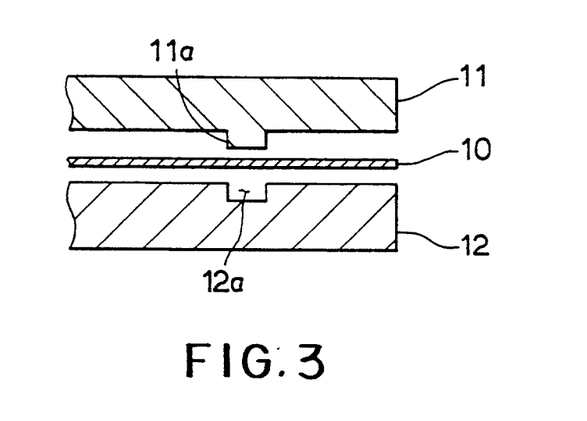
FIG. 3 is a cross-sectional view taken along the line III—III of FIG. 2.

In this embodiment, a non-magnetic hollow-shape cylindrical bobbin 9 (refer to FIG. 9) around which coils are wound, a copper plate 10 provided as a raw-material of the coils, an upper die 11 and a lower die 12 are first prepared. The copper plate 10 is pinched between the upper and lower dies 11 and 12, as shown in FIGS. 2 and 3. The upper and lower dies 11 and 12 respectively have a protrusion 11a (refer to FIG. 3) and a groove 12a which coincide with a predetermined curled planar shape into which coil pieces are formed before they are attached as gradient coils to an outer circumferential surface of the bobbin 9 by being curved.

Figure 4:
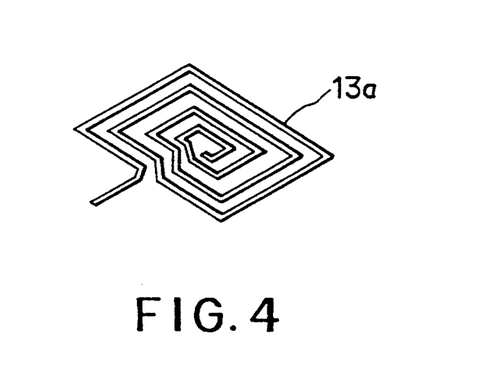
FIG. 4 is a perspective view of a copper coil piece stamped out.
Figure 5:
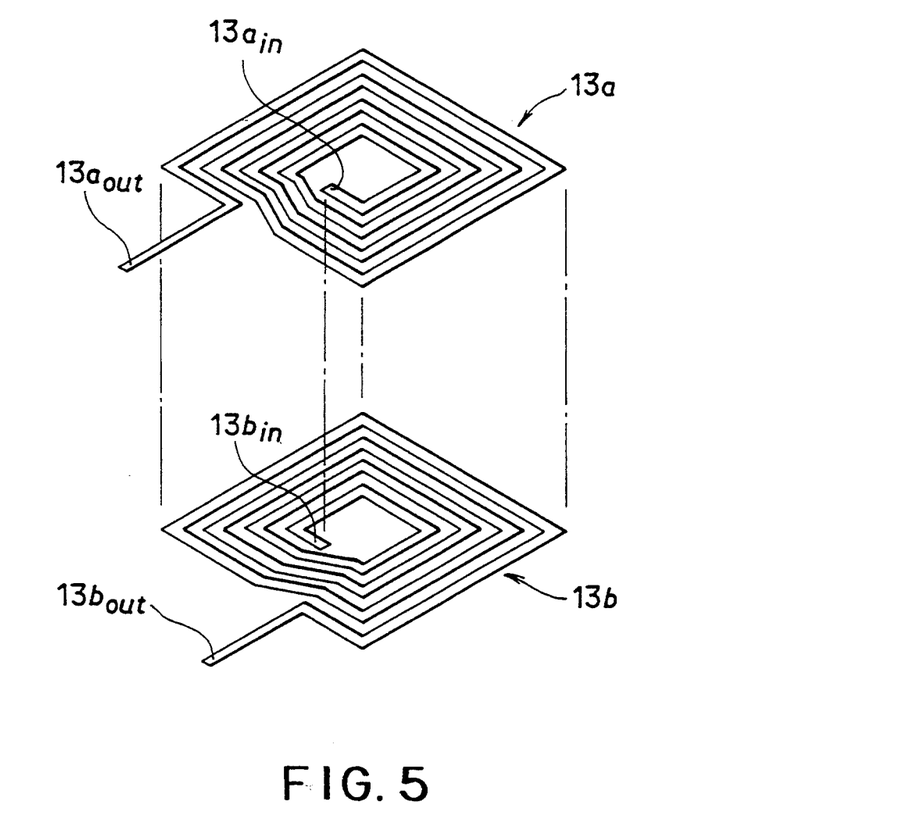
FIG. 5 is a perspective view of a pair of copper coil pieces having opposite curling directions with each other.

The upper and lower dies 11 and 12 are then pressed against each other. A flat coil piece 13a having a curled shape coinciding with the shape of the protrusion 11a and groove 12a is thereby stamped out, as shown in FIGS. 4 and 5. According to the flat coil piece 13a, one outer end portion 13a out along its curled passage provides one terminal for electric connection with a lead wire and the other inner end portion 13a in therein provides the other terminal for it.

Assume that each gradient coil consists of two layers, that is, two flat coil pieces. For constructing such two-layer gradient coils, the other flat coil piece 13b being paired is stamped out by the same processes described above. In that case, as shown in FIG. 5, the flat coil piece 13b is set to be opposite curling direction to that of the flat coil piece 13a and to have one outer end portion $13b_{out}$ and the other inner end portion $13b_{in}$ along its curled passage for electric connection.

Figure 6:
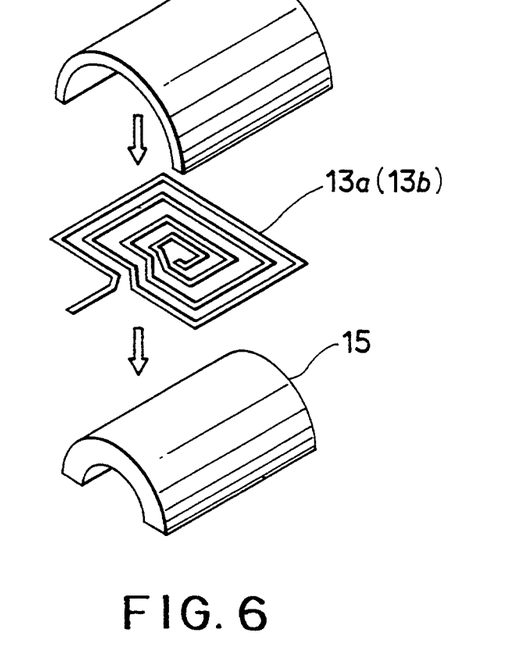
FIG. 6 is a diagram of a step of forming the copper coil piece.
Figure 7:
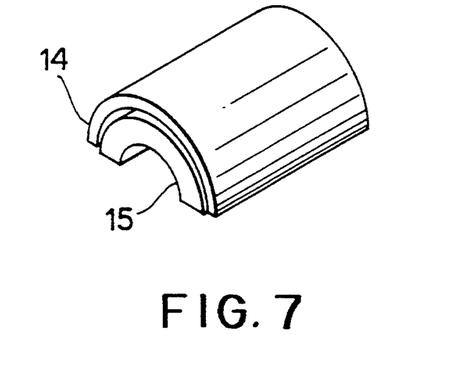
FIG. 7 is a perspective view of a pair of frames between which the copper coil piece is pinched.
Figure 8:
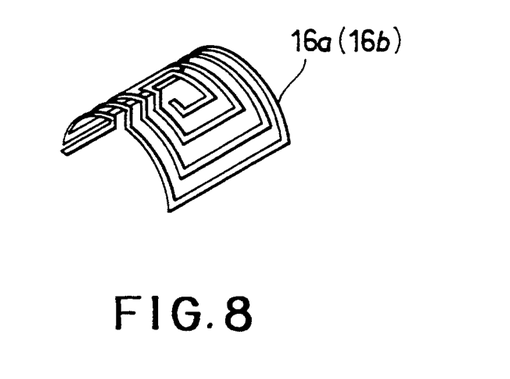
FIG. 8 is a perspective view of the copper coil piece formed.

FIG. 6 is a perspective view of a process for forming the above-described flat coil piece 13a and 13b into a curved shape such as to be able to be attached to the bobbin 9. The flat coil piece 13a(13b) is pinched between an upper frame 14 and a lower frame 15 each having a saddle-like shape and having the same curvature as a circular-arc surface of the cylindrical bobbin 9 in a prdetermined area (see FIG. 7). As the upper and lower frames 14 and 15 are pressed, the flat coil piece 13a(13b) is formed into the shape of a saddle-like-coil piece 16a(16b), as shown in FIG. 8.

Members used as the upper and lower dies 11 and 12 and the upper and lower frames 14 and 15 are formed with high accuracy of the die position and the curvature, so that there is substantially no deformation such as undulation of the formed saddle-like coil pieces 16a and 16b.

A necessary number of the saddle-like coil pieces 16a and 16b are manufactured by the above-described process using the upper and lower dies 11 and 12 and the upper and lower frames 14 and 15.

In this embodiment, flat coil pieces 13a and 13b are stamped out and are thereafter curved into the shape of coil pieces 16a and 16b which can be attached to the bobbin 9. However, a process may alternatively be used in which a pair of dies respectively having a protrusion and a groove formed in conformity with the final shape of a coil piece to be attached to the bobbin are used to perform stamping and forming simultaneously so that the coil piece which can be directly attached to the bobbin is stamped out.

Figure 9:
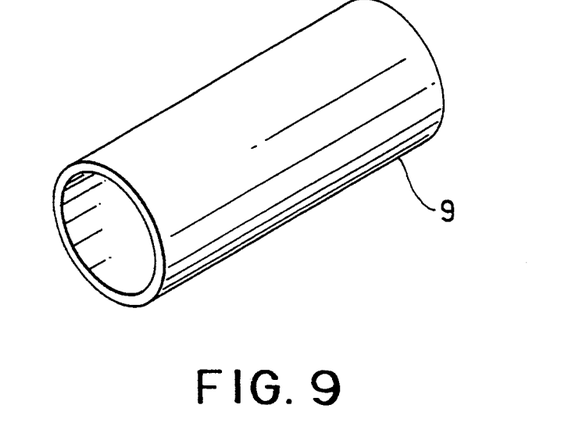
FIG. 9 is a perspective view of a hollow bobbin.

FIG. 9 shows the hollow cylindrical bobbin 9 to which each of the upper and lower frames 14 and 15 is conformed.

Figure 10:
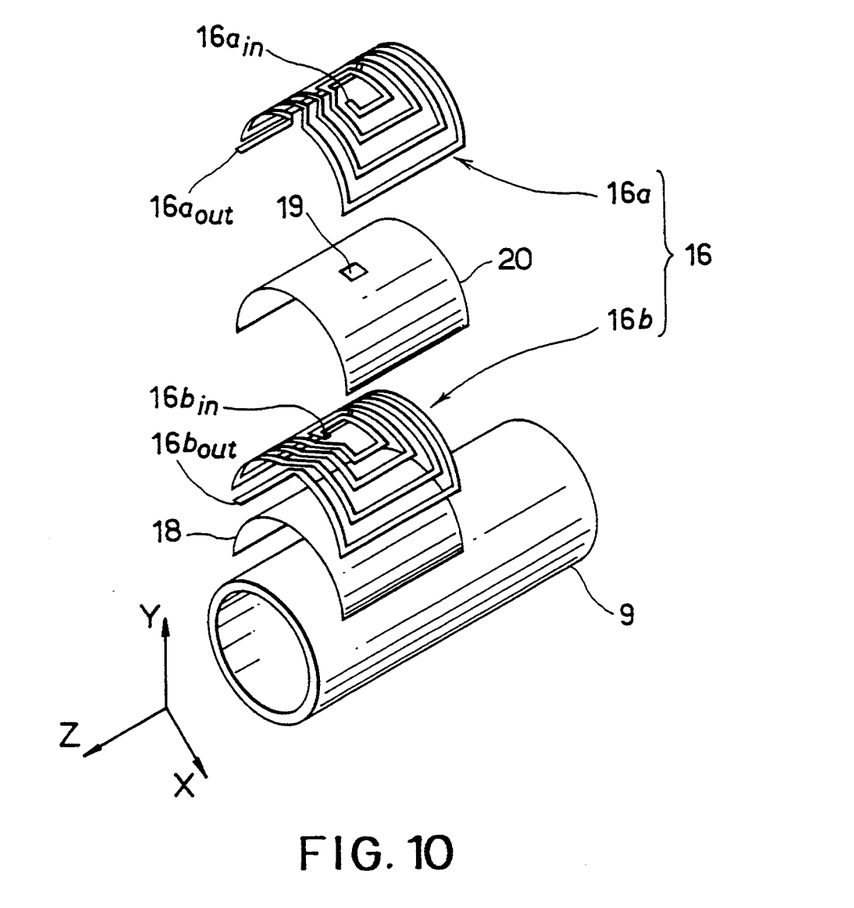
FIG. 10 is a diagram of a step of superposing copper coil pieces.

Then, an insultating/bonding sheet 18, the saddle-like coil piece 16b, another insulating/bonding sheet 20 having a hole 19 at a predetermined position, and a saddle-like coil piece 16a to be paired with the coil piece 16b are laid one on another in this order, as shown in FIG. 10. The position of the hole 19 is arranged to coincide with that of the inner end portion $16b_{in}$ and $16a_{in}$ of the coil pieces 16b and 16a.

Then, the inner end portions $16b_{in}$ and $16a_{in}$ of the saddle-like coil pieces 16b and 16a are electrically connected (by soldering, for example) through the hole 19 of the insulating/bonding sheet 20, and the outer end portions $16b_{out}$ and $16a_{out}$ are respectively used as current input and output terminals. As a result, the saddle-like coil pieces 16b and 16a make up a gradient coil 16, which is two-layered in the radial direction of the bobbin 9 and is connected in series and curled in the opposite directions with each other so that magnetic flux from the coil pieces 16b and 16a generates in a same direction (i.e., Y-direction in this embodiment).

Figure 11:
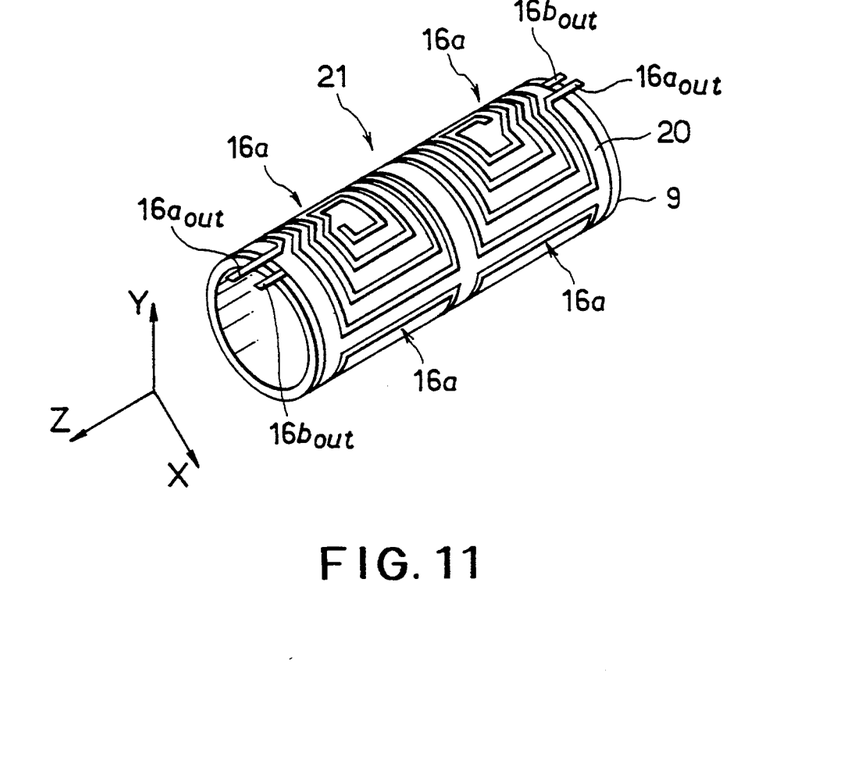
FIG. 11 is a perspective view of a gradient coil unit to which x-coils are attached.
Figure 12:
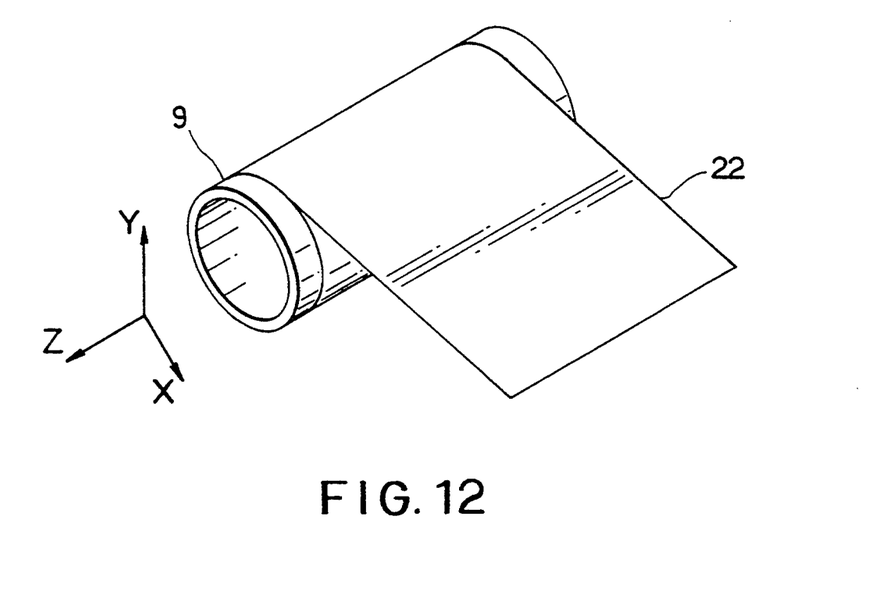
FIG. 12 is a perspective view of the gradient coil unit on which an insulating/bonding sheet is wound to enable attachment of Y-coils.

FIG. 11 is a perspective view of a gradient coil unit 21 which is completed by attaching four gradient coils 16 . . . 16. In FIG. 11, a vertical direction corresponds to the Y-direction. For the four gradient coils 16 . . . 16 in FIG. 11, left-sided two coils 16 and 16 make one pair and right-sided two coils 16 and 16 make one pair, two pairs in all. Each coil 16 of the two pairs is disposed on the upper or lower part in each side of the bobbin 9. Further, an electric current of a same direction is supplied to the coils 16 and 16 of each pair, even though oppsite to each other between the two pairs of coils. Therefore, this gradient coil unit 21 can generate a gradient magnetic field in the Y-direction.

Consequently, in this embodiment, the number of coil turns is increased by forming two layers of coil portions for one current input-output loop. That is, the gradient magnetic field intensity with respect to one current input-output loop can be increased. Also, in contrast with a coil unit formed by the conventional method, there is no intersection of conductor portions in each gradient coil 16 and, hence, no space extending from such an intersection in the direction of Z-axis without containing a coil. According to the method of this embodiment, the overall thickness of coil layers can be reduced and a smaller gradient coil unit can be provided which achieving the same gradient magnetic field intensity. It is thereby possible to reduce the overall size of the MRI system and to improve the MRI system in terms of economy and operation facility.

The gradient coils on one bobbin 9 can be arranged to form gradient magnetic fields in a plurality of directions (i.e., a plurality of channels along X-, Y-, and Z-axes). FIGS. 12 to 17 show a process for such an arrangement. After coil layers for forming a gradient magnetic field in the direction of Y-axis as shown in FIG. 11, an insulating/bonding sheet 22 having no holes is wound so as to cover the coil layers of Y-axis (refer to FIG. 12). By this step, coil layers for forming gradient magnetic fields in different directions can be maintained in a completely insulated state.

Figure 13:
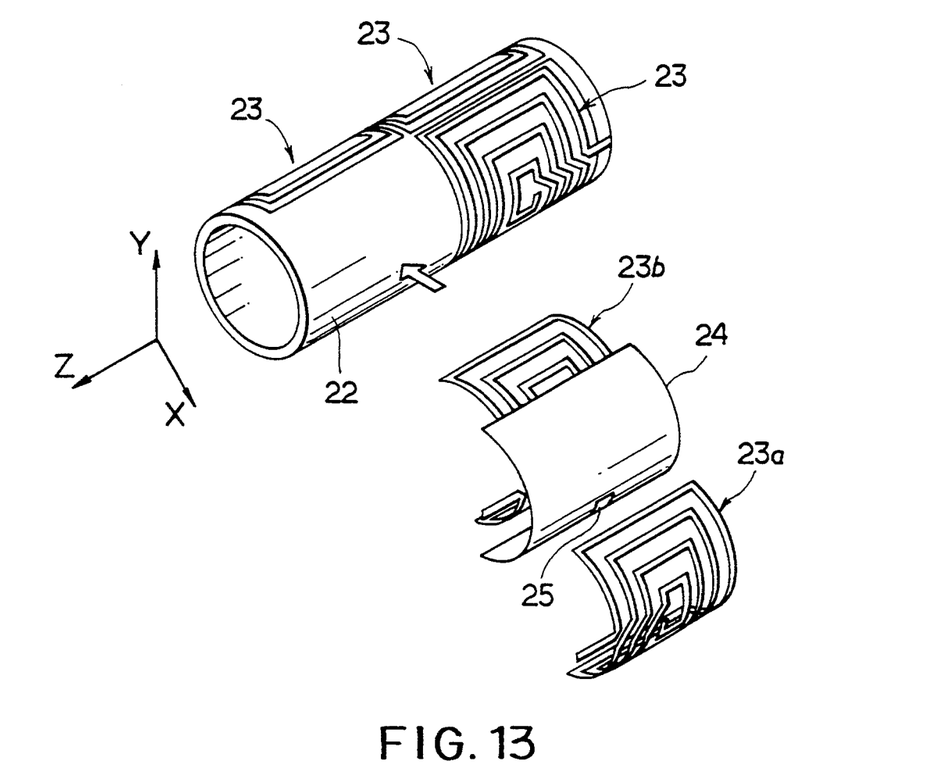
FIG. 13 is a diagram of a step of superposing copper coil pieces for a gradient magnetic field in an X-direction.

Then, as shown in FIG. 13, layers of saddle-like coil pieces 23b and 23a stamped out and formed in the same manner as the above-described Y-axis coil pieces 16b and 16a are laid one on another with an insulating-/bonding sheet 24 having a hole 25 interposed therebetween. The two coil pieces 23b and 23a form a one gradient coil 23. Four X-axis coils 23 . . . 23 each consisting of two coil piece layers are thereby attached in the same manner as the Y-axis coils 16 . . . 16, forming a gradient magnetic field in the X-direction.

Figure 14:
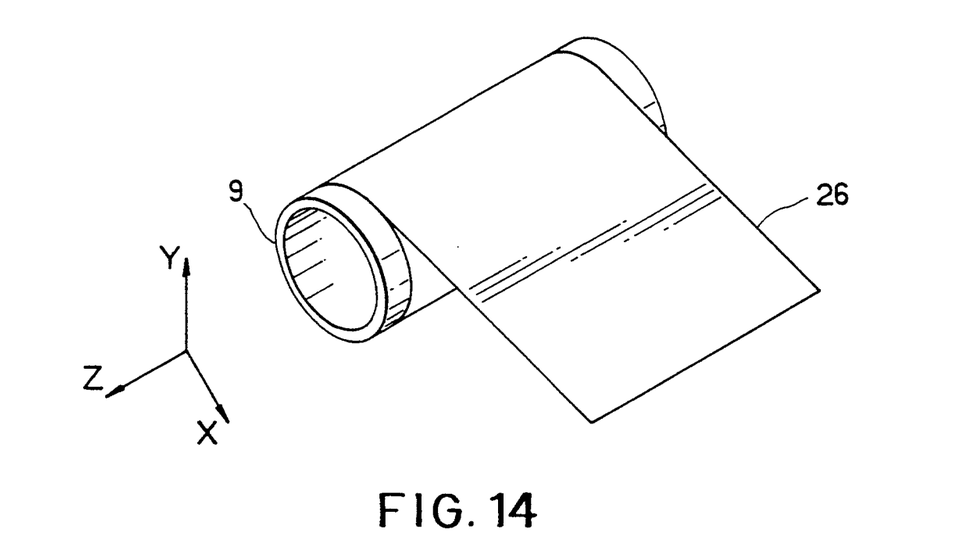
FIG. 14 is a perspective view of the gradient coil unit on which an insulating/bonding sheet is wound to enable attachment of z-coils.
Figure 15:
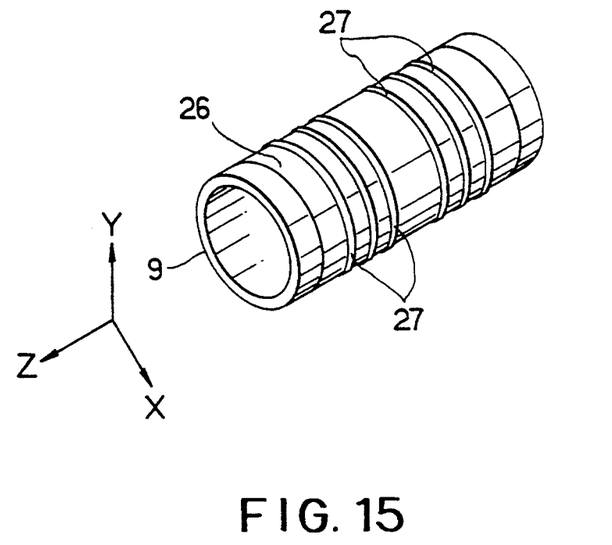
FIG. 15 is a perspective view of the gradient coil unit on which z-coils are wound.

If Z-axis gradient coils are further attached, the X-axis gradient coils 23 . . . 23 are previously covered with an insulating/bonding sheet 26 having no hole, as shown in FIG. 14. The Z-axis gradient coils 27 and 27 are formed into the shape of a solenoid and are wound by a conventional method, as shown in FIG. 15. Further, An insulating/bonding sheet 28 having no holes is wound around the Z-axis gradient coils 27 and 27.

Figure 16:
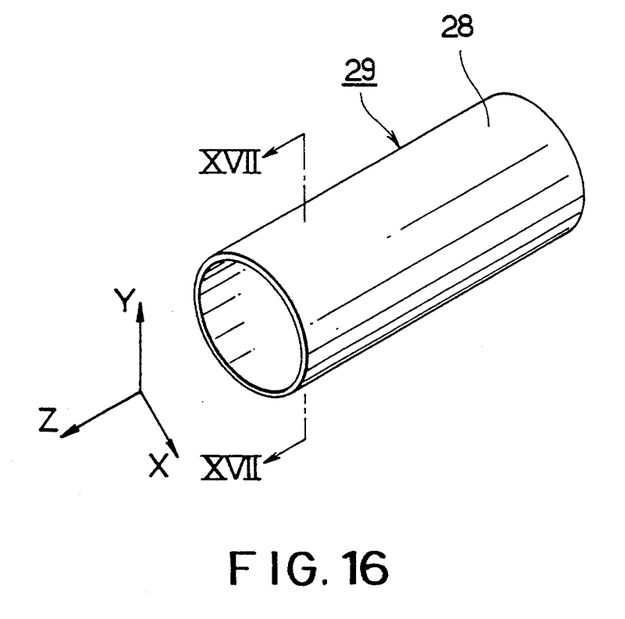
FIG. 16 is a perspective view of the gradient coil unit to which coils for the three gradient magnetic fields are attached by the method of the first embodiment.
Figure 17:
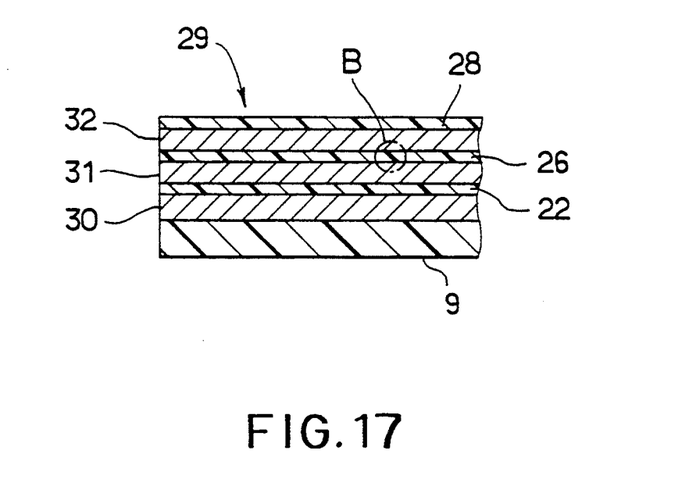
FIG. 17 is a cross-sectional view taken along the line XVII—XVII of FIG. 16.

FIG. 16 is a perspective view of a gradient coil unit 29 completed in this manner and capable of forming gradient magnetic fields in the directions of the three axes, X, Y, and Z. FIG. 17 is a cross-sectional view taken along the line XVII—XVII of FIG. 16. As shown in FIG. 17, in this embodiment are provided a gradient coil layer 30 by the coils 16 . . . 16 for forming a gradient magnetic field in the direction of Y-axis, a gradient coil layer 31 by the coils 23 . . . 23 for forming a gradient magnetic field in the direction of Y-axis, and a gradient coil layer 32 by coils 27, 27 for forming a gradient magnetic field in the direction of Z-axis. (That is, each of the gradient coil layers 30 to 32 consists of two layers of coil pieces between which an insulating/bonding sheet having a hole is interposed and which are connected through this hole, although details thereof are not illustrated in FIG. 17.) Insulating/bonding sheets 22, 26 and 28 each having no hole are wound as boundary layers between the gradient coil layers 30, 31, and 32 and an outermost layer.

The order in which the gradient coil layers are laminated is not limited to that described above with respect to this embodiment; the gradient coil layers can be laminated in any order.

Figure 18:
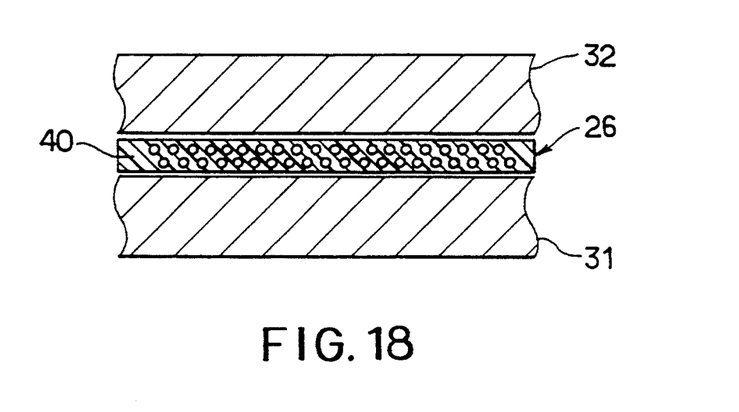
FIG. 18 is a cross-sectional view of a portion B shown in FIG. 17 before heating.
Figure 19:
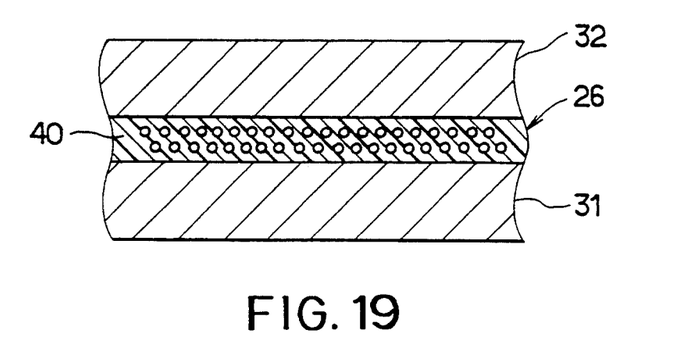
FIG. 19 is a cross-sectional view of the portion B shown in FIG. 17 after heating.

In this embodiment, glass cloth (formed of glass fibers) impregnated with thermosetting epoxy resin 40 is used as insulating/bonding sheets. FIGS. 18 and 19 are enlarged diagrams of states of a portion B shown in FIG. 17 before and after heating the glass cloth.

That is, thermosetting epoxy resin 40 in insulating-/bonding sheet 26 which is formed of glass cloth and through which the copper-made gradient coil layers 31 and 32 face each other is not completely set and is in a solid state or a liquid state of a very high viscosity before it is heated. In this state, therefore, the degree of adhesion between the gradient coil layers 31 and 32 and epoxy resin 40 covering glass fibers is not sufficiently high. When the whole of the gradient coil unit is heated (at a temperature of about 100° to 150° C., which temperature is selected according to the kind of the epoxy resin), epoxy resin 40 becomes a low-viscosity liquid to adhere to the gradient coil layers 31 and 32 and is then set to fix the gradient coil layers 31 and 32. The desired insulation between the gradient coil layers 31 and 32 can be maintained by virtue of the glass fiber.

Figure 20:
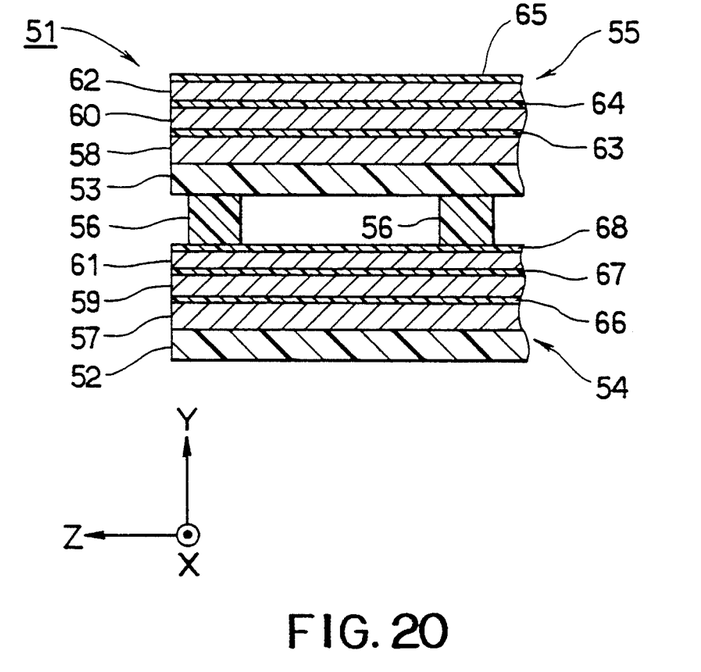
FIG. 20 is a cross-sectional view of an active shield-type gradient coil unit manufactured by a method in accordance with a second embodiment of the present invention.

FIG. 20 is a cross-sectional view of a portion of an active shield-type gradient coil unit 51 manufactured by a method in accordance with a second embodiment of the present invention. The active shield-type gradient coil unit 51 is manufactured in such a manner that an inner gradient coil unit 54 and an outer gradient coil unit 55 manufactured on a bobbin 52 and another bobbin 53 having a diameter greater than that of the bobbin 52 in the same manner as the first embodiment are doubly combined with non-magnetic spacers 56 ... 56 interposed therebetween.

Each of the inner gradient coil unit 54 and the outer gradient coil unit 55 has the similar cross section as that shown in FIG. 17. That is, a layer 57 or 58 of a Y-axis gradient coil, a layer 59 or 60 of an X-axis gradient coil and a layer 61 or 62 for a Z-axis gradient coil are disposed on the outer circumferential surface of the bobbin 52 or 53 in the same order. Insulating/bonding sheets 66, 67 and 68 each having no holes are wound boundary layers between the gradient coil layers 57, 59 and 61 of the inner gradient coil unit 54 and an outermost layer of this coil unit, and insulating/bonding sheets 63, 64 and 65 each having no holes are wound as boundary layers between the gradient coil layers 58, 60 and 62 of the outer gradient coil unit 55 and an outermost layer of this coil unit.

In the active shield-type gradient coil unit 51 manufactured by the method of this embodiment, currents are caused to flow in opposite directions through each of the pairs of gradient coil layers of the inner gradient coil unit 54 and the outer gradient coil unit 55 capable of forming gradient magnetic fields in a common channel (i.e. a common direction). In this manner, a necessary magnetic field can be formed in the space inside the inner gradient coil unit 54 with respect to each channel while no magnetic field is formed on the space outside the outer gradient coil unit 55.

By the way, the number of superposition of gradient coil pieces in one gradient coil need not be limited to two (i.e. two layers of coil pieces) and three or more layers can be adopted with further similar steps. Further, when superposition of gradient coil pieces is not needed (i.e., one layer), a gradient coil and a method of manufacturing the same in accordance with the present invention can be used by adopting only a preparatory step, a stamping step and a forming step. A gradient coil in accordance with the present invention can be applied to only an x-coil or a y-coil. An insulating adherent sheet of the present invention is not limited to the insulating/bonding sheet formed of glass cloth impregnated with thermosetting epoxy resin, and can also use similar other sheets having sufficient insulation and adhesion. A curling pattern of an x- and a y-coils is not limited to the patterns in the above embodiments and also can be changed into other patterns if required.

What is claimed is:

1. A method of manufacturing a gradient coil for magnetic resonance imaging, in which the gradient coil consists of at least one of the x-coil and y-coil among an x-coil, a y-coil and a z-coil wound on predetermined positions of a nonmagnetic hollow cylindrical bobbin, said method comprising:
   a prepatory step of preparing a conductor plate;
   a stamping step of stamping said gradient coil having a predetermined pattern out of the prepared conductor plate; and
   a forming step of curving the stamped gradient coil in a conformity with a curvature of an outer circumferential surface of the bobbin.

2. A method of manufacturing a gradient coil for magnetic resonance imaging., in which the gradient coil consists of at least one of the x-coil and y-coil among an x-coil, a y-coil and a z-coil wound on predetermined positions of a nonmagnetic hollow cylindrical bobbin, said method comprising:
   a preparatory step of preparing a conductor plate;
   a stamping step of stamping a plurality of gradient coil pieces having a predetermined pattern out of the prepared conductor plate;
   a forming step of curving the stamped gradient coil pieces in conformity with a curvature of an outer circumferential surface of the bobbin; and
   a lamination step of superposing the curved gradient coil pieces one on another.

3. A method of manufacturing a gradient coil for magnetic resonance imaging, in which the gradient coil consists of at least one of the x-coil and y-coil among an x-coil, a y-coil and a z-coil wound on predetermined positions of a nonmagnetic hollow cylindrical bobbin, said method comprising:
   a preparatory step of preparing a conductor plate and an insulating adherent sheet;
   a stamping step of stamping a plurality of gradient coil pieces having a predetermined pattern out of the prepared conductor plate the gradient coil pieces forming the gradient coil;
   a forming step of curving the stamped gradient coil pieces in conformity with a curvature of an outer circumferential surface of the bobbin; and
   a lamination step of superposing the curved gradient coil pieces one on another while interposing the prepared insulating adherent sheet therebetween.

4. A method according to claim 3, wherein said plurality of gradient coil pieces consist of two gradient coil pieces.

5. A method according to claim 4, wherein said preparatory step includes a step of selecting said sheet having a role at a predetermined position of the sheet, said stamping step is a step of stamping two gradient coil pieces having oppositely directional curling patterns as the predetermined pattern to each other and each having an end portion being positioned at the hole of the sheet, and said lamination step includes a step of arranging the end portions of the two gradient coil pieces at the hole of the sheet and a step of electrically connecting in series the end portions through the hole.

6. A method of manufacturing a gradient coil unit for magnetic resonance imaging in which x-coils, y-coils and z-coils are as the gradient coil wound on predetermined positions of a nonmagnetic hollow cylindrical bobbin, said method comprising:
   a first process for manufacturing each of the x-and y-coils, said first process including a preparatory step of preparing a conductor plate and a plurality of insulating adherent sheets, a stamping step of stamping a plurality of x-coil pieces and a plurality of y-coil pieces each having a predetermined pattern out of the prepared conductor plate, the x-coil pieces and the y-coil pieces each forming the x-coil and the y-coil, a forming step of curving each of the stamped x- and y-coil pieces in conforming with a curvature of an outer circumferential surface of the bobbin, and a lamination step of superposing the x- and y-coil pieces every kind of coil pieces while interposing one of the prepared insulating adherent sheets therebetween every kind of pieces; and
   a second process of laminating the x- and y-coils and said z-coils at predetermined positions on the bobbin while interposing corresponding one of the insulating adherent sheets therebetween.

7. A method according to claim 6, wherein said plurality of x-coil pieces consist of two x-coil pieces and said plurality of y-coil pieces consist of two y-coil pieces.

8. A method according to claim 7, wherein said preparatory step includes a step of selecting the plurality of sheets having a hole at a predetermined position of the sheets, said stamping step is a step of stamping the two x-coil pieces and the two y-coil pieces, each of the two x-coil pieces and the two y-coil pieces having oppositely directional curling patterns as the predetermined pattern to each other and each of the two x-coil pieces and each the two y-coil pieces having an end portion being positioned at the hole of one of the sheets, and said lamination step includes a step of arranging each of the two pieces and the two y-coil pieces at the hole of one of the sheets and a step of electrically connecting in series the end portions through the hole.

9. A method according to claim 6, wherein said preparatory step includes a step of selecting as said sheets plurality of glass cloths impregnated with an epoxy resin, and said lamination step includes a step of heating the laminated gradient coils.

10. A method according to claim 6, wherein said preparatory step includes a step of selecting a copper plate as said conductor plate.

11. A method of manufacturing a gradient coil unit for magnetic resonance imaging in which x-coils, y-coils and z-coils are as the gradient coil wound on predetermined positions of a nonmagnetic hollow cylindrical bobbin, said method comprising:

a first process for manufacturing the x- and y-coils, said first process including a first preparatory step of preparing a conductor plate and a plurality of insulating adherent sheets, a second preparatory step of preparing two bobbins having different diameters, a stamping step of stamping a plurality of x-coil pieces and a plurality of y-coil pieces each having a predetermined pattern out of the prepared conductor plate, the x-coil pieces and the y-coil pieces each forming the x-coil and the y-coil, a forming step of curving each of groups of the stamped x- and y-coil pieces in conformity with curvatures of outer circumferential surfaces of the two bobbins, and a lamination step of superposing individually each of the groups of x- and y-coils as said x- and y-coils while interposing one of the prepared insulating adherent sheets therebetween;

a second process of laminating the x- and y-coils and said z-coils at predetermined positions on the two bobbins each while interposing another one of the insulating adherent sheets therebetween after said first process; and a third process including a step of preparing a nonmagnetic spacer and a step of fitting the two bobbins one in another with said spacer interposed therebetween after said second process.

12. A method according to claim 11, wherein said plurality of x-coil pieces consist of two x-coil pieces and said plurality of y-coil pieces consist of two y-coil pieces.

13. A method according to claim 11, wherein said first preparatory step includes a step of selecting the plurality of sheets each having a hole at a predetermined position of the sheets, said stamping step is a step of stamping the two x-coil pieces and the two y-coil pieces, each of the two x-coil pieces and the two y-coil pieces having oppositely directional curling patterns as the predetermined pattern to each other and each of the two x-coil pieces and each the two y-coil pieces having an end portion being positioned at the hole of one of the sheets, and said lamination step includes a step of arranging each of the two x-coil pieces and the two y-coil pieces at the hole of one of the sheets and a step of electrically connecting in series the end portions through the hole.

14. A method according to claim 13, wherein said first preparatory step includes a step of selecting as said sheets a plurality of glass cloths impregnated with an epoxy resin, and said lamination step includes a step of heating the laminated gradient coils.

15. A method according to claim 13, wherein said first preparatory step includes a step of selecting a copper plate as said conductor plate.

16. A method according to claim 13, wherein said method is applied to manufacture an active shield-type gradient coil unit.

* * * * *